(12) United States Patent
Lin (10) Patent No.: US 6,827,132 B1
(45) Date of Patent: Dec. 7, 2004

(54) RADIATION APPARATUS

(75) Inventor: Shu-Ju Lin, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/667,450

(22) Filed: Sep. 23, 2003

(51) Int. Cl.$^7$ ............................................. F28D 15/00
(52) U.S. Cl. ........................... 165/104.21; 165/107.33; 165/80.4; 361/700; 174/15.2; 257/715
(58) Field of Search ................. 165/104.21, 104.26, 165/104.33, 185; 361/700, 699; 257/714–716; 174/15.2

(56) References Cited

U.S. PATENT DOCUMENTS

| | | | | |
|---|---|---|---|---|
| 4,921,041 A | * | 5/1990 | Akachi ................ | 165/104.29 |
| 6,005,772 A | * | 12/1999 | Terao et al. .............. | 361/699 |
| 6,189,601 B1 | * | 2/2001 | Goodman et al. ......... | 165/80.3 |
| 6,394,175 B1 | * | 5/2002 | Chen et al. ............... | 165/80.3 |
| 6,469,894 B2 | * | 10/2002 | Ubukata .................. | 361/700 |
| 6,600,649 B1 | * | 7/2003 | Tsai et al. ................ | 361/697 |
| 2002/0166655 A1 | * | 11/2002 | Sugito et al. ........ | 165/104.21 |
| 2003/0173063 A1 | * | 9/2003 | Suzuki ................. | 165/104.19 |

* cited by examiner

Primary Examiner—Terrell Mckinnon
(74) Attorney, Agent, or Firm—Birch, Stewart, Kolasch & Birch, LLP (57) ABSTRACT

A radiation apparatus for dispersing heat energy generated by a heat-generating element includes a first and a second board chambers, a condenser tube, an evaporation tube and working fluid. The condenser tube and the evaporation tube have respectively two ends located on the first and the second board chambers. The first and second board chambers, condenser tube and evaporation tube jointly form a closed space to contain the working fluid. The working fluid in the evaporation tube absorbs heat energy from the heat-generating element and vaporizes to flow through the first board chamber to the condenser tube. In the condenser tube, the heat energy previously absorbed in vaporized working fluid is dispersed and the working fluid is condensed to become liquid flowing through the second board chamber to the evaporation tube to proceed another heat dissipation cycle. Thus heat dissipation efficiency may increase in the limited space of the server.

14 Claims, 7 Drawing Sheets

RADIATION APPARATUS

FIELD OF THE INVENTION

The invention relates to a radiation apparatus adopted for use on heat-generating elements to disperse heat.

BACKGROUND OF THE INVENTION

The central processors used in servers generally generate a lot of heat energy during operation. Hence a radiation apparatus usually is provided to disperse the heat.

Figure 1:
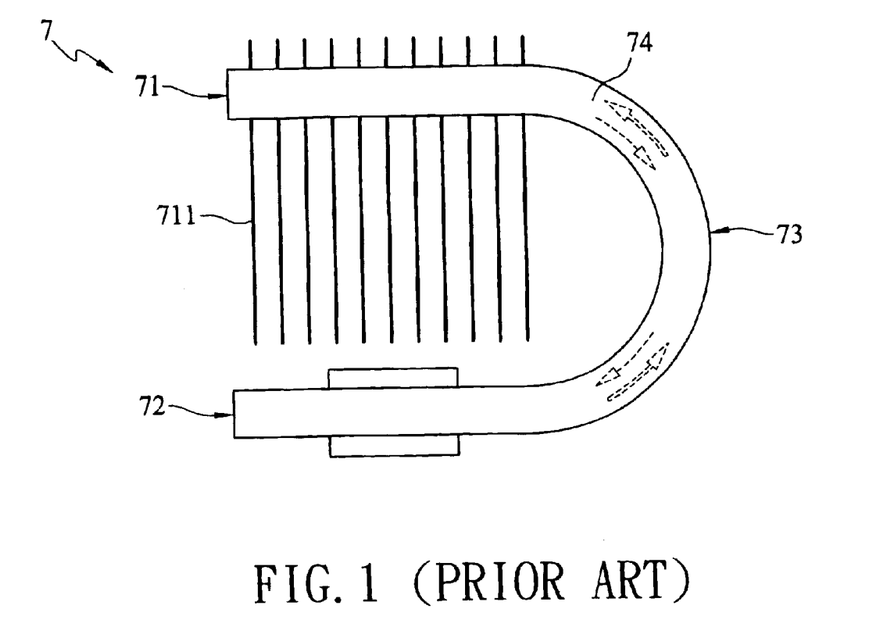
FIG. 1 is a schematic view of a conventional radiation tube.

Refer to FIG. 1 for a conventional radiation apparatus. It has a heat conduction tube 7, which includes a condenser tube 71 and an evaporation tube 72. Radiation fins 711 surround the condenser tube 71. An elbow tube 73 bridges the condenser tube 71 and the evaporation tube 72. The condenser tube 71, evaporation tube 72 and elbow tube 73 are connected to form a conduit. The heat conduction tube 7 contains working fluid 74. In such a design the radius of the elbow tube 73 has to be at least four times the inner diameter of the heat conduction tube 7.

When in use, the working fluid 74 in the evaporation tube 72 absorbs heat energy and becomes vapor. The vapor passes through the elbow tube 73 and flows upward to the condenser tube 71. The heat energy is dispersed through the radiation fins 711 so that the vapor is cooled and becomes liquid again. The liquid working fluid 74 flows through the elbow tube 73 to the evaporation tube 72 due to capillary force, to proceed another heat dissipation cycle.

As the present server usually has to house many electronic devices, the spared inner space is limited. The way in which the elbow tube 73 is designed and made, occupies a lot of space in the server. Heat dissipation efficiency also is affected, due to dimensional constraint. Moreover, with more space taken by the elbow tube 73, the space that may be allocated for the radiation fins 711 on the condenser tube 71 becomes smaller. As a result, in the limited space of the server, trade off has to be made for the dimensions of various elements. Therefore the radiation structure set for the situation mentioned above cannot fully use the limited space of the server, and improving heat dissipation efficiency is difficult.

SUMMARY OF THE INVENTION

The primary object of the invention is to provide a radiation apparatus to fully utilize the limited space of the server and improve heat dissipation efficiency.

The radiation apparatus according to the invention aims at dispersing heat energy generated by heat-generating elements. The radiation apparatus includes a first board chamber, a second board chamber, a condenser tube, an evaporation tube and working fluid. The condenser tube has two ends located respectively on the first and second board chambers. The evaporation tube also has two ends located respectively on the first and second board chambers. The first board chamber, second board chamber, condenser tube and evaporation tube jointly form a closed space. The working fluid is contained in the closed space. The working fluid in the evaporation tube may absorb heat energy from the heat-generating element and become vaporized working fluid, which flows through the first board chamber to the condenser tube. In the condenser tube, the heat energy previously absorbed in vaporized working fluid is dispersed and the working fluid is condensed to become liquid, which flows through the second board chamber to the evaporation tube to proceed another heat dissipation cycle.

As the first board chamber and the second board chamber of the invention are formed in a board type, they do not take as much space as the conventional elbow tube does. Thus the invention can improve heat dissipation efficiency in the limited space of the server.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 2:
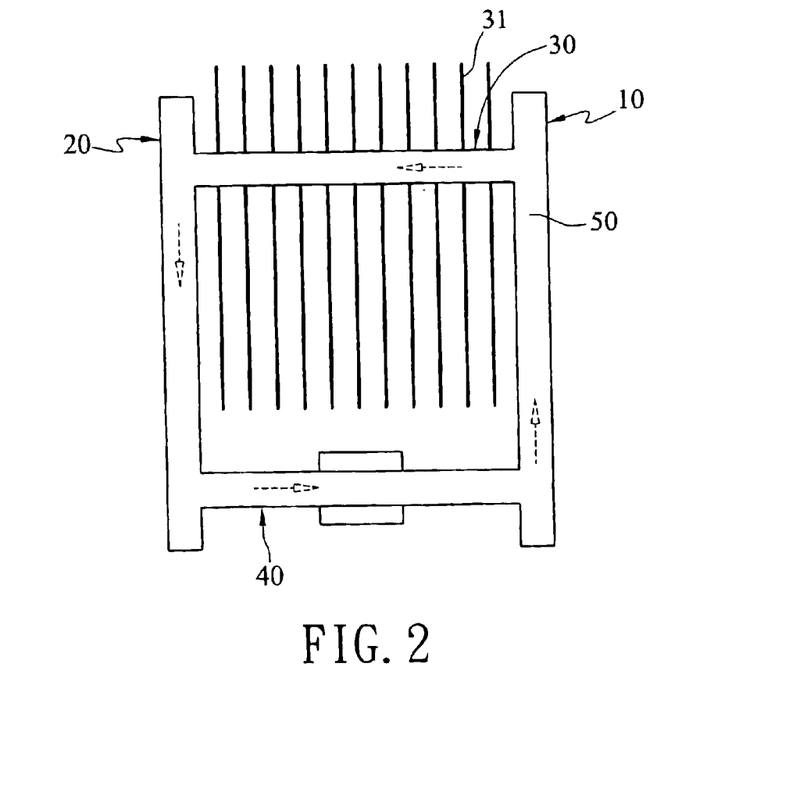
FIG. 2 is a schematic view of a first embodiment of the radiation apparatus of the invention.
Figure 3:
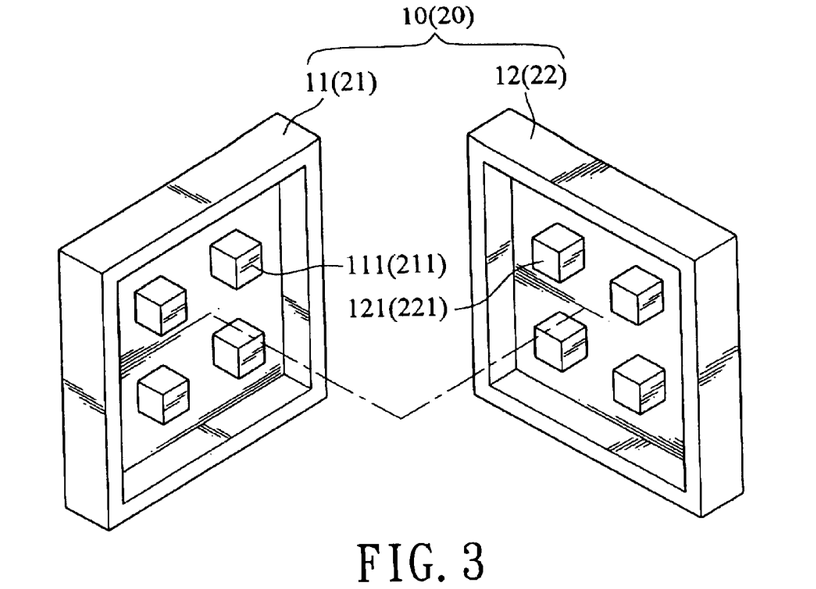
FIG. 3 is an exploded view of the first board chamber and the second board chamber of the invention.

Refer to FIGS. 2 and 3 for a first embodiment of the radiation apparatus of the invention. It aims to disperse heat energy generated by a heat-generating element. The radiation apparatus includes a first board chamber 10, a second board chamber 20, a condenser tube 30, an evaporation tube 40 and working fluid 50. The first board chamber 10 includes a first heat conduction member 11 and a second heat conduction member 12 that are soldered together. The first heat conduction member 11 has a first reinforced block 111 located inside. The second heat conduction member 12 has a second reinforced block 121, located inside, corresponding to the first reinforced block 11. The second board chamber 20 includes a first heat conduction member 21 and a second heat conduction member 22 that are soldered together. The first heat conduction member 21 has a first reinforced block 211 located inside. The second heat conduction member 22 has a second reinforced block 221, located inside, corresponding to the first reinforced block 211.

The condenser tube 30 has two ends soldered respectively on the first board chamber 10 and the second board chamber 20, and is surrounded by a plurality of radiation fins 31.

The evaporation tube 40 has two ends soldered respectively on the first board chamber 10 and the second board chamber 20. The first board chamber 10, second board chamber 20, condenser tube 30 and evaporation tube 40 jointly form a closed space. The working fluid 50 is contained in the closed space.

When in use, the working fluid 50 in the evaporation tube 40 absorbs heat energy from the heat-generating element and becomes vaporized working fluid 50 which flows through the first board chamber 10 to the condenser tube 30. In the condenser tube 30, the heat energy previously absorbed in vaporized working fluid 50 is dispersed and the working fluid 50 is condensed to become liquid which flows through the second board chamber 20 to the evaporation tube 40 to proceed another heat dissipation cycle. Of course when the working fluid 50 disperses heat in the condenser tube 30, the radiation fins 31 help to speed up heat dissipation absorbed in the working fluid 50.

As the first board chamber 10 and the second board chamber 20 of the invention are formed in a board type, they do not take as much space as the elbow tube 73 used in conventional techniques (referring to FIG. 1). As a result, the length of the condenser tube 30 and evaporation tube 40 may be increased, and a greater number of radiation fins 31 may be deployed on the condenser tube 30. Thus the invention can improve heat dissipation efficiency in the limited space of the server.

Figure 4:
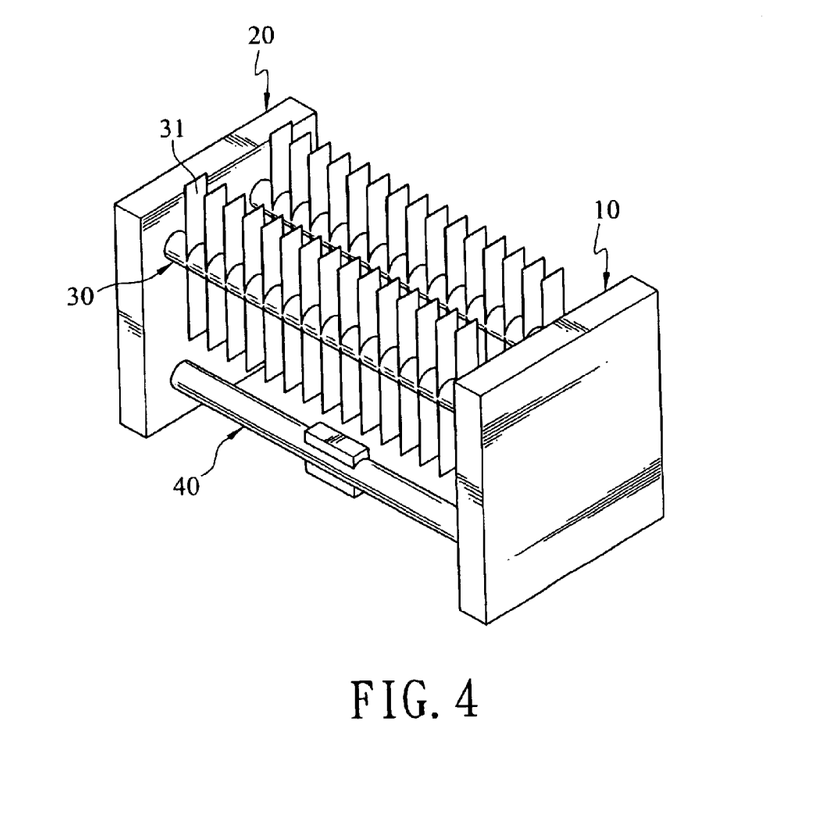
FIG. 4 is a schematic view of a second embodiment of the radiation apparatus of the invention.
Figure 5:
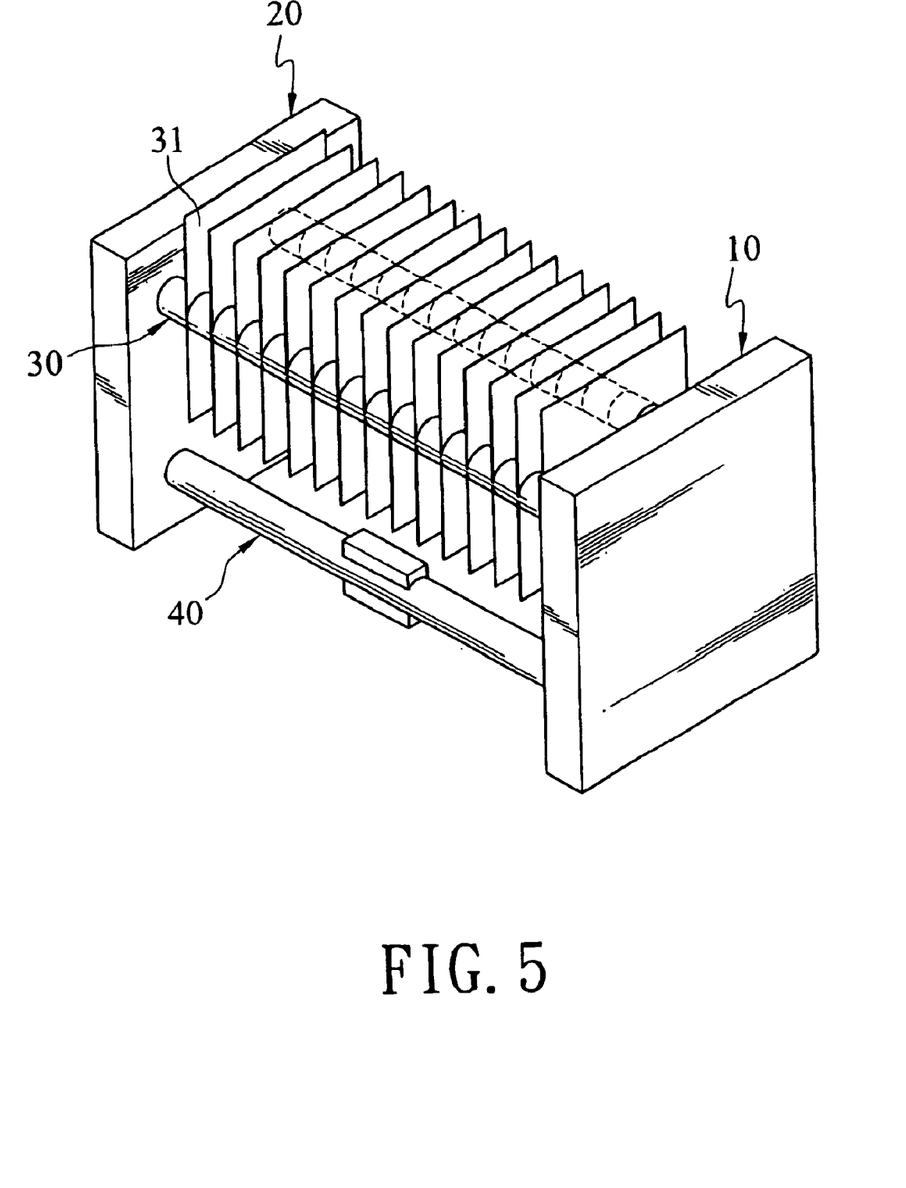
FIG. 5 is a schematic view of a third embodiment of the radiation apparatus of the invention.

Refer to FIG. 4 for a second embodiment of the radiation apparatus of the invention. The number of condenser tubes 30 is greater than one. Hence heat energy absorbed by the working fluid 50 in the evaporation tube 40 may be dispersed through a plurality of condenser tubes 30 to increase heat dissipation efficiency. Refer to FIG. 5 for a third embodiment of the radiation apparatus of the invention. The radiation fins 31 of different condenser tubes 30 are connected together.

Figure 6:
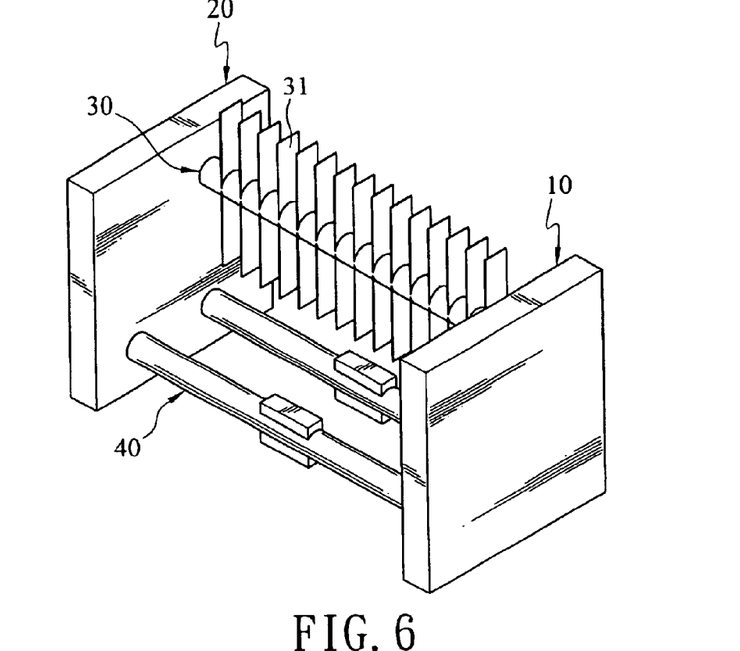
FIG. 6 is a schematic view of a fourth embodiment of the radiation apparatus of the invention.

Refer to FIG. 6 for a fourth embodiment of the radiation apparatus of the invention. The number of evaporation tubes 40 is greater than one and to be located on different heat-generating elements to disperse heat energy generated thereof.

Figure 7:
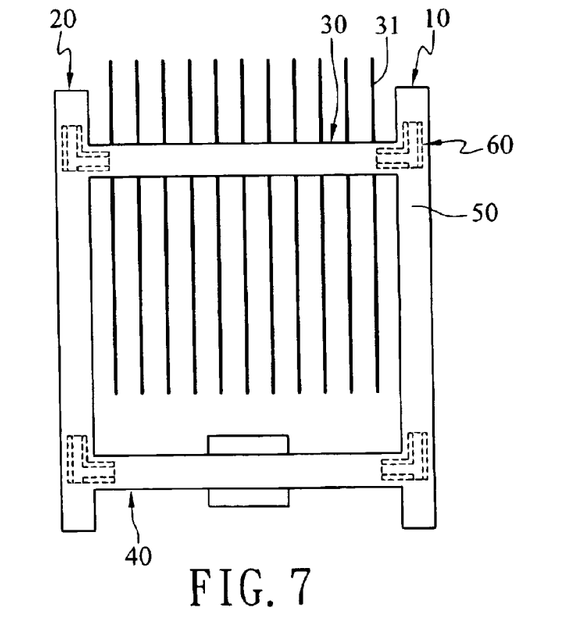
FIG. 7 is a schematic view of the invention showing the condenser tube and evaporation tube connecting to the first and second board chambers.

Refer to FIG. 7 for the connecting relationship between the condenser tube 30 and evaporation tube 40 to the first board member 10 and the second board member 20. The connection may be accomplished through coupling ducts 60. The outer diameter of the coupling duct 60 mates the inner diameter of the condenser tube 30 and the evaporation tube 40 to be connected with the condenser tube 30 and the evaporation tube 40.

Figure 8A:
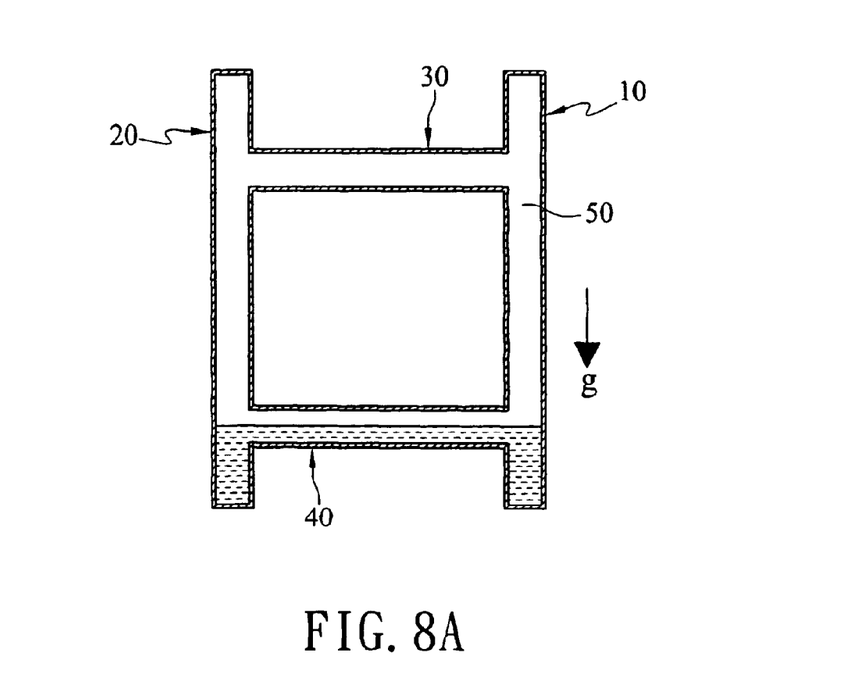
FIGS. 8A and 8B are schematic views of the invention showing working fluid contained in a closed space.
Figure 8B:
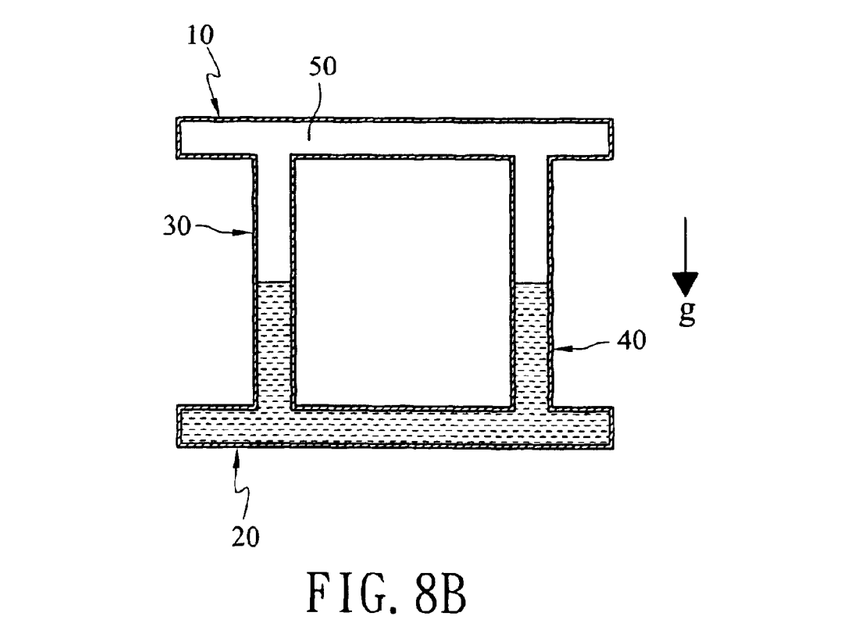

It is to be noted that the working fluid 50 contained in the first board chamber 10, second board chamber 20, condenser tube 30 and evaporation tube 40 has volume restriction. Too much working fluid 50 filled in the closed space will result in not effective flowing of the vaporized working fluid 50 to the condenser tube 30, while too little working fluid 50 in the closed space will result in poorer heat dissipation efficiency. Referring to FIGS. 8A and 8B, when the first board member 10 and the second board member 20 are positioned vertically on a flat surface, the preferable volume of the working fluid 50 is to have the liquid level reaching 40% to 60% of the evaporation tube 40. Then, when the working fluid 50 is vaporized, it can flow in the apparatus of the invention as desired. When the first board chamber 10 and the second board chamber 20 are laid in parallel on a flat surface, the preferable volume of the working fluid 50 is to have the liquid level reaching one half of the evaporation tube 40.

Figure 9:
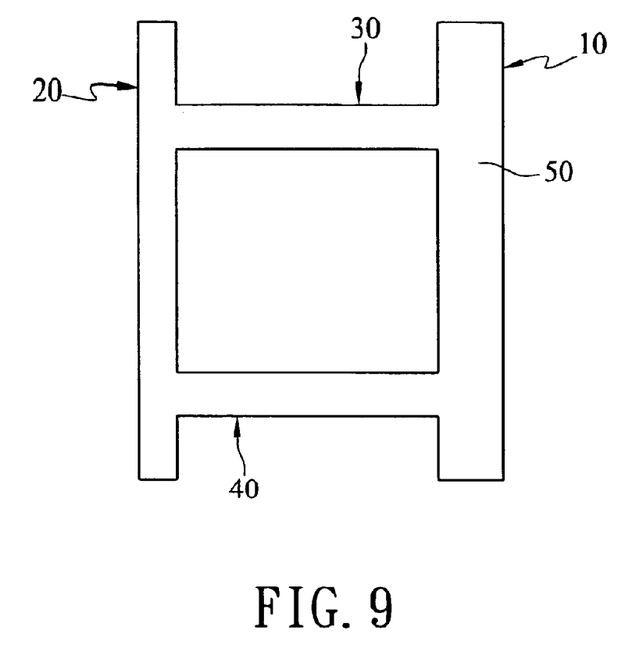
FIG. 9 is a schematic view of the invention showing a first embodiment of the flow direction restriction structure.

When the working fluid 50 is vaporized, if there is no suitable flow restriction structure, the vaporized working fluid 50 will flow to the first board chamber 10 and the second board chamber 20, and one way heat dissipation circulation cycle, as mentioned before, cannot be achieved. Refer to FIG. 9 for a first embodiment of the flow direction restriction structure. The first board chamber 10 has a greater cross section than the second board chamber 20. The working fluid 50 will flow through the first board chamber 10 that has a smaller resistance to the condenser tube 30, then flow through the second board chamber 20 to the evaporation tube 40, to proceed the next heat dissipation cycle.

Figure 10:
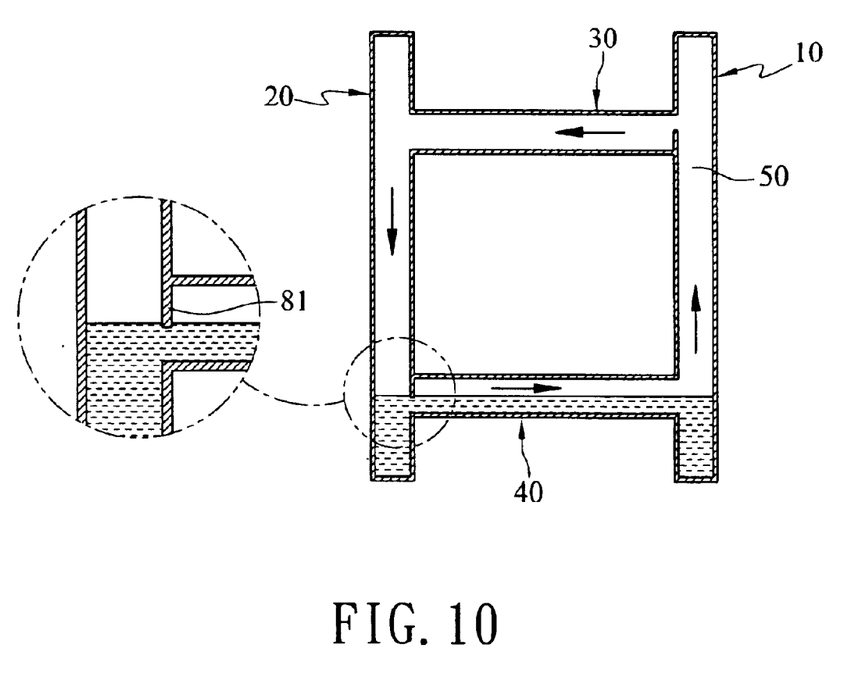
FIG. 10 is a schematic view of the invention showing a second embodiment of the flow direction restriction structure.

Refer to FIG. 10 for a second embodiment of the flow direction restriction structure. There is a partition 81, located at the bottom juncture of the first board chamber 10 and a condenser tube 30, to prevent the working fluid 50 from flowing back to the first board chamber 10, after having been condensed to liquid. There is also a partition 81, located at the top juncture of the second board chamber 20, and the evaporation tube 40 with the length of the partition 81 greater than one half of the evaporation tube 40. This is to prevent the liquid level from exceeding one half of the evaporation tube 40 and prevent the vaporized working fluid 50 from flowing back to the second board chamber 20. The vaporized working fluid 50 may flow through the first board chamber 10 to the condenser tube 30 and be condensed to liquid, then flow through the second board chamber 20 to the evaporation tube 40 to proceed the next heat dissipation cycle.

Figure 11:
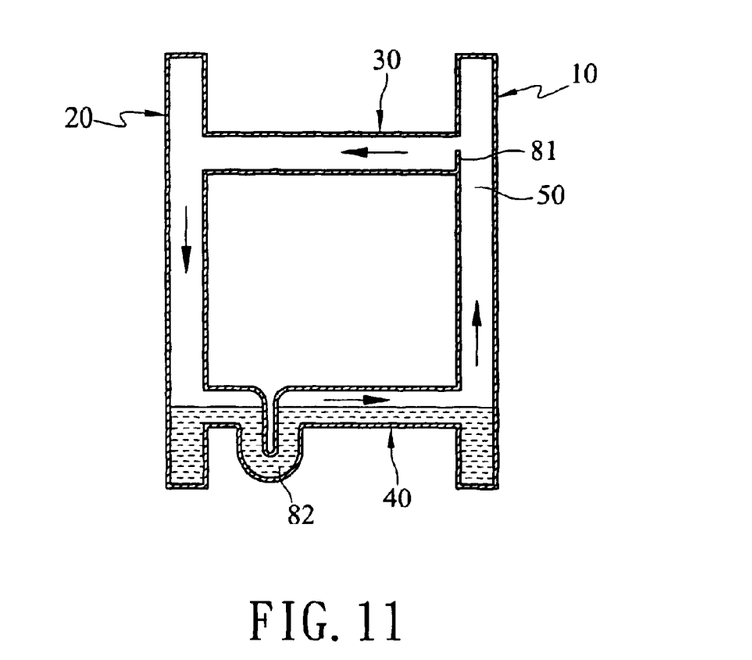
FIG. 11 is a schematic view of the invention showing a third embodiment of the flow direction restriction structure.
Figure 12:
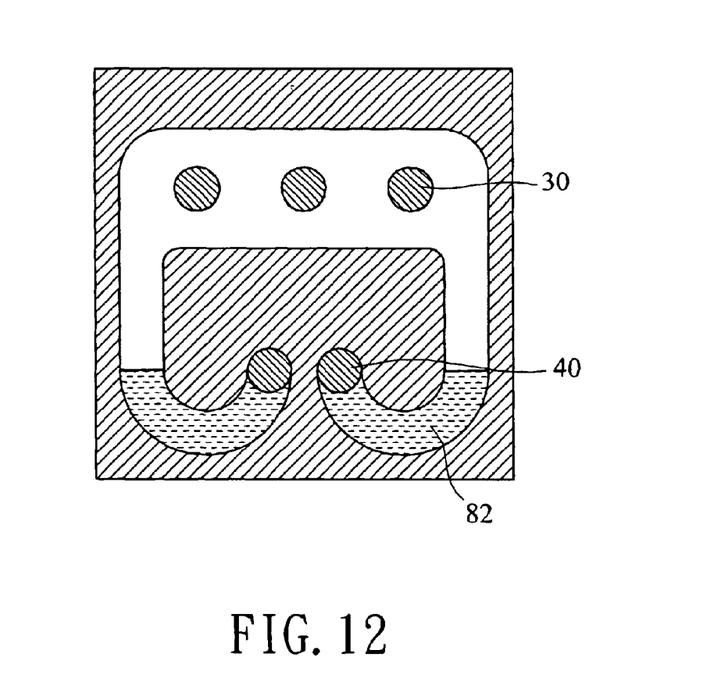
FIG. 12 is a schematic view of the invention showing a fourth embodiment of the flow direction restriction structure.

Refer to FIGS. 11 and 12 for a third and a fourth embodiment of flow direction restriction structure. The partition 81 at the top juncture of the second board chamber 20 and the evaporation tube 40 previously discussed, may be replaced by a trap section 82 located on the bottom of the second board chamber 20, or on the bottom of the evaporation tube 40, adjacent to one end of the second board chamber 20. Therefore, the vaporized working fluid 50 may be prevented from flowing to the second board chamber 20. The third and fourth embodiments may be coupled with the partition 81 at the bottom juncture of the first board chamber 10 and the condenser 30 shown in FIG. 10, to achieve one way heat dissipation circulation for the working fluid 50.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A radiation apparatus for dispersing heat energy generated by a heat-generating element, comprising:
   a first board chamber and a second board chamber;
   a condenser tube having two ends located respectively on the first board chamber and the second board chamber;
   an evaporation tube having two ends located respectively on the first board chamber and the second board chamber, the first board chamber, the second board chamber, the condenser tube and the evaporation tube jointly forming a closed space; and working fluid contained in the closed space;

wherein the working fluid in the evaporation tube absorbs the heat energy of the heat-generating element to become vapor, the vaporized working fluid flowing through the first board chamber to the condenser tube, the vaporized working fluid dispersing the heat energy previously absorbed in the condenser tube and being condensed to liquid which flows through the second board chamber to the evaporation tube to proceed heat dissipation of a next cycle, and wherein the first board chamber includes a first heat conduction member and a second heat conduction member that are coupled together by soldering.

2. The radiation apparatus of claim 1, wherein the first heat conduction member includes a first reinforced block located inside, and the second heat conduction member includes a second reinforced block, located inside, corresponding to the first reinforced block.

3. The radiation apparatus of claim 1, wherein the two ends of the condenser tube are connected respectively to the first board chamber and the second board chamber by soldering.

4. The radiation apparatus of claim 1, wherein the two ends of the evaporation tube are connected respectively to the first board chamber and the second board chamber by soldering.

5. The radiation apparatus of claim 1, wherein the working fluid contained in the closed space has a liquid level reaching 40% to 60% of the evaporation tube when the first board chamber and the second board chamber are positioned vertically on a flat surface, and the working fluid contained in the closed space has a liquid level reaching one half of the evaporation tube when the first board chamber and the second board chamber are positioned in parallel on a flat surface.

6. A radiation apparatus for dispersing heat energy generated by a heat-generating element, comprising:

a first board chamber and a second board chamber;

a condenser tube having two ends located respectively on the first board chamber and the second board chamber;

an evaporation tube having two ends located respectively on the first board chamber and the second board chamber, the first board chamber, the second board chamber, the condenser tube and the evaporation tube jointly forming a closed space; and working fluid contained in the closed space;

wherein the working fluid in the evaporation tube absorbs the heat energy of the heat-generating element to become vapor, the vaporized working fluid flowing through the first board chamber to the condenser tube, the vaporized working fluid dispersing the heat energy previously absorbed in the condenser tube and being condensed to liquid which flows through the second board chamber to the evaporation tube to proceed heat dissipation of a next cycle, and wherein the second board chamber includes a first heat conduction member and a second heat conduction member that are coupled together by soldering.

7. The radiation apparatus of claim 6, wherein the first heat conduction member includes a first reinforced block located inside, and the second heat conduction member includes a second reinforced block, located inside, corresponding to the first reinforced block.

8. The radiation apparatus of claim 6, wherein the two ends of the condenser tube are connected respectively to the first board chamber and the second board chamber by soldering.

9. The radiation apparatus of claim 6, wherein the two ends of the evaporation tube are connected respectively to the first board chamber and the second board chamber by soldering.

10. A radiation apparatus for dispersing heat energy generated by a heat-generating element, comprising:

a first board chamber and a second board chamber;

a condenser tube having two ends located respectively on the first board chamber and the second board chamber;

an evaporation tube having two ends located respectively on the first board chamber and the second board chamber, the first board chamber, the second board chamber, the condenser tube and the evaporation tube jointly forming a closed space; and working fluid contained in the closed space;

wherein the working fluid in the evaporation tube absorbs the heat energy of the heat-generating element to become vapor, the vaporized working fluid flowing through the first board chamber to the condenser tube, the vaporized working fluid dispersing the heat energy previously absorbed in the condenser tube and being condensed to liquid which flows through the second board chamber to the evaporation tube to proceed heat dissipation of a next cycle, the radiation apparatus further having a flow direction restriction structure for restricting the working fluid from flowing through the first board chamber to the condenser tube, the working fluid in the condenser tube dispersing the absorbed heat energy and flowing through the second board chamber to the evaporation tube to proceed heat dissipation of the next cycle.

11. The radiation apparatus of claim 10, wherein the flow direction restriction structure is making the first board chamber having a cross section greater than that of the second board chamber.

12. The radiation apparatus of claim 10, wherein the flow direction restriction structure includes two partitions, one of the partition being located at a bottom juncture of the first board chamber and the condenser tube, other of the partition being located at a top juncture of the second board chamber and the evaporation tube at a length exceeding one half of the evaporation tube.

13. The radiation apparatus of claim 10, wherein the flow direction restriction structure includes a partition and a trap section, the partition being located at a bottom juncture of the first board chamber and the condenser tube, the trap section bottom of the second board chamber.

14. The radiation apparatus of claim 10, wherein the flow direction restriction structure includes a partition and a trap section, the partition being located at a bottom juncture of the first board chamber and the condenser tube, the trap section being located on the bottom of the evaporation tube adjacent to one end of the second board chamber.

* * * * *